(12) United States Patent
Yoo et al.

(10) Patent No.: US 7,439,596 B2
(45) Date of Patent: Oct. 21, 2008

(54) TRANSISTORS FOR SEMICONDUCTOR DEVICE AND METHODS OF FABRICATING THE SAME

(75) Inventors: Jae-Yoon Yoo, Seoul (KR); Hwa-Sung Rhee, Seongnam-si (KR); Tetsuji Ueno, Suwon-si (KR); Ho Lee, Gwangju-gun (KR); Seung-Hwan Lee, Seoul (KR); Hyun-Suk Kim, Seoul (KR); Moon-Han Park, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 114 days.

(21) Appl. No.: 11/045,060

(22) Filed: Jan. 31, 2005

(65) Prior Publication Data

US 2005/0170620 A1 Aug. 4, 2005

(30) Foreign Application Priority Data

Jan. 29, 2004 (KR) .................. 10-2004-0005858

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................ 257/412; 257/384; 257/369; 257/388

(58) Field of Classification Search ............. 257/410, 257/522, 288, 369, 411, 412, 769, 384, 382, 257/413

See application file for complete search history.

(56) References Cited

U.S. PATENT DOCUMENTS

| 4,780,429 | A | 10/1988 | Roche et al. |
| 6,124,177 | A | 9/2000 | Lin et al. |
| 6,344,397 | B1 | 2/2002 | Horstmann et al. |
| 6,465,309 | B1 | 10/2002 | Xiang et al. |
| 6,846,734 | B2 * | 1/2005 | Amos et al. .............. 438/592 |
| 2002/0072184 | A1 | 6/2002 | Higuchi |
| 2004/0004259 | A1 * | 1/2004 | Wu ........................... 257/411 |

FOREIGN PATENT DOCUMENTS

| JP | 2002-43563 | | 2/2002 |
| JP | 2002-043563 | * | 2/2002 |
| KR | 1020020069502 A | | 9/2002 |

OTHER PUBLICATIONS

A. Chatterjee et al., "Sub-100nm Gate Length Metal Gate NMOS Transistors Fabricated by a Replacement Gate Process," 1997 IEDM p. 821-824.
Jakub Kedzierski et al, "Metal-gate FinFET and fully-depleted SOI devices using total gate silicidation," 2002 IEEE p. 825-828.
Tabel, B. et al., Totally silicided (CoSi2) Polysilicon: a novel approach to very Low-resistive gate without metal CMP nor etching, IEEE, 2001, pp. 37.5.1-37.5.4.

* cited by examiner

*Primary Examiner*—Chuong A. Luu
(74) *Attorney, Agent, or Firm*—Volentine & Whitt, PLLC.

(57) ABSTRACT

The present invention discloses a transistor for a semiconductor device capable of preventing the generation of a depletion capacitance in a gate pattern due to the diffusion of impurity ions. The present invention also discloses a method of fabricating the transistor.

9 Claims, 14 Drawing Sheets

TRANSISTORS FOR SEMICONDUCTOR DEVICE AND METHODS OF FABRICATING THE SAME

BACKGROUND OF INVENTION

1. Technical Field

The present invention generally relates to transistors for a semiconductor device and methods of fabricating the same.

A claim of priority is made to Korean Patent Application No. 10-2004-0005858, filed Jan. 29, 2004, the contents of which are incorporated by reference in their entirety.

2. Discussion of the Related Art

Conventional semiconductor devices have a transistor. The transistor includes a gate pattern and impurity regions disposed on a semiconductor substrate of the devices. Electrical characteristics of the transistor depend on the gate pattern and the impurity regions. The gate pattern has at least one conductive layer. The conductive layer is formed of a doped polysilicon or a metal silicide stacked on the doped polysilicon. The impurity regions generally refer to source and drain regions of the transistor, and each region is formed by an impurity ion implantation process.

However, impurity ions may diffuse into the gate pattern when the transistor is driven. The diffusion causes a depletion capacitance in the gate pattern. Thus, the depletion capacitance causes a voltage applied to the gate pattern to drop, which delays the immediate voltage transfer to the semiconductor substrate. Further, the voltage may drop as much as the capacitance, thereby deteriorating a driving capability of the transistor. Therefore, even though a gate pattern having a conductive layer is advantageous because it simplifies a fabrication process, a method to suppress the depletion capacitance is required.

U.S. Pat. No. 6,124,177 discloses, for example, a conventional method of fabricating a deep sub-micron MOSFET structure with improved electrical characteristics.

This method discloses forming an arch-shaped gate pattern on a semiconductor substrate. The gate pattern is formed of an undoped polysilicon layer. Ion implantation processes are performed in the semiconductor substrate by using the gate pattern as a mask to form N source and drain areas. The source and drain areas are impurity regions, which overlap the gate pattern. And the source and drain areas produce a gradual concentration gradient in a direction away from the gate pattern.

The method further includes forming gate spacers, which do not cover sidewalls of the gate pattern. That is, air spacers are formed between the gate spacers and the sidewalls of the gate pattern. Using the gate spacers and the gate pattern as a mask, an ion implantation process is used to form N+ source and drain areas in the semiconductor substrate. The conductivity type of the gate pattern is determined during the formation of the N+ source and drain contact areas as well as the source and drain N– areas. Then, a silicidation process is performed on the semiconductor substrate to form a silicide layer on the N+ source and drain areas and the gate pattern.

However, this method forms a silicide layer on the gate pattern. Thus, this method cannot protect against diffusion of impurity ions through the doped polysilicon portion of the gate pattern, which can cause a depletion capacitance. Therefore, a method to suppress the generation of the depletion capacitance is required.

SUMMARY OF THE INVENTION

According to an embodiment of the present invention, there is provided a transistor for a semiconductor device having a diffusion barrier region and electrode region disposed in an active region of a semiconductor substrate, wherein the electrode region is located between the diffusion barrier and a surface of the semiconductor substrate, a gate insulating layer disposed on the semiconductor substrate, a silicide gate pattern disposed on the gate insulating layer, and n electrode pattern disposed adjacent the gate pattern, and contacting the electrode region.

The present application also discloses a method of manufacturing a transistor for a semiconductor device by forming a gate insulating on a semiconductor gate, forming a sacrificial poly layer pattern on the gate insulating layer, performing a first ion implantation process on the sacrificial poly layer pattern, forming a first metal layer on the sacrificial ploy layer pattern, and performing a first silicide process between the first metal layer and the sacrificial poly layer pattern, thereby forming a gate pattern, wherein the gate pattern is completely a silicide layer.

The method is further manufactured by sequentially performing second and third ion implantation processes on the semiconductor substrate mask, to form an impurity electrode definition region and a diffusion barrier region, respectively, forming a gate spacer on sidewalls of the gate pattern, performing a fourth ion implantation process on the electrode definition region, the gate pattern, and the gate spacers, to form an impurity electrode region, wherein the electrode definition region and the impurity electrode definition define an electrode region, forming a second metal layer on the silicide gate pattern and the electrode definition region, and performing a second silicide process on the second metal layer and the electrode definition region, thereby forming an electrode pattern.

BRIEF DESCRIPTION OF THE DRAWINGS

Embodiments of the present invention will be readily apparent to those of ordinary skill in the art upon review of the detailed description that follows when taken in conjunction with the accompanying drawings, in which like reference numerals denote like parts.

DETAILED DESCRIPTION OF THE INVENTION

Figure 1:
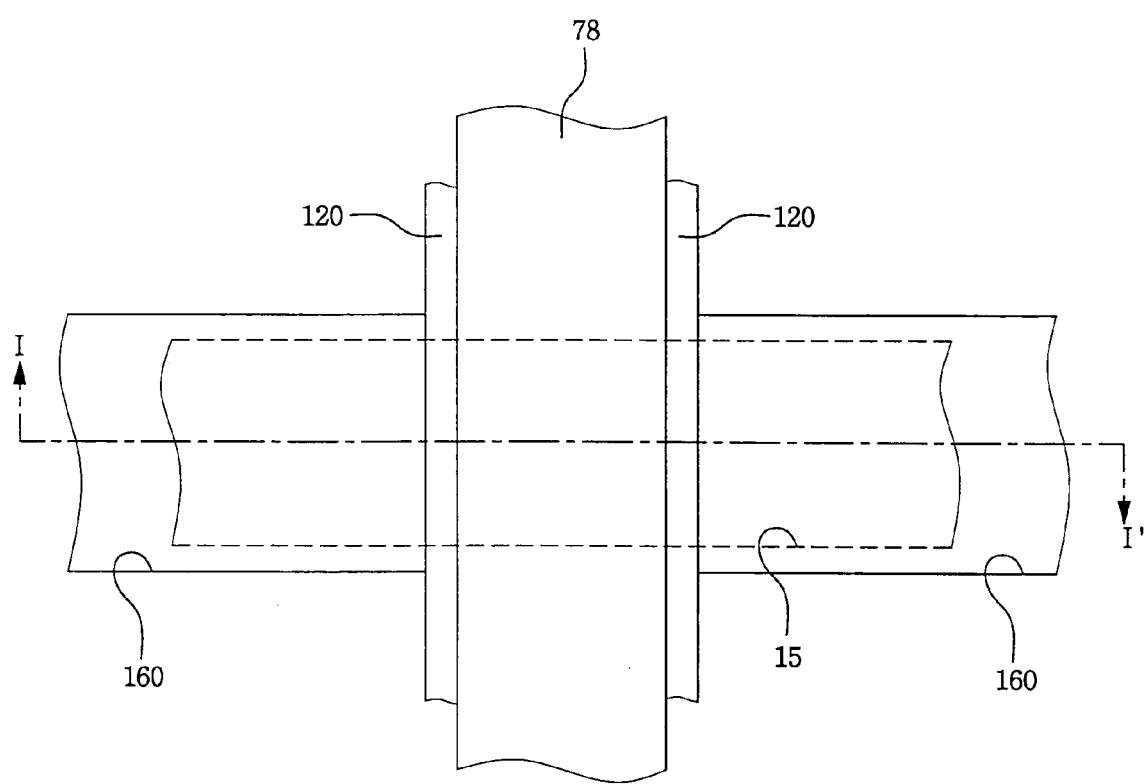
FIG. 1 is a layout of a transistor according to the present invention.
Figure 2:
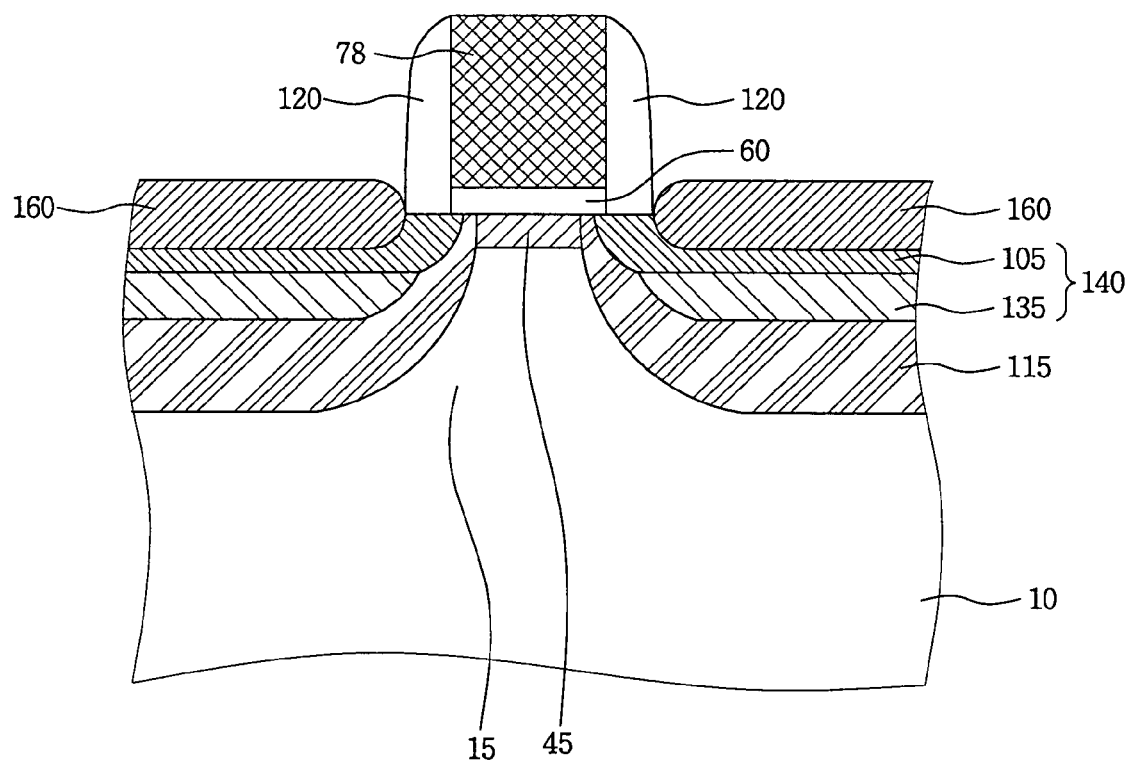
FIG. 2 is a sectional view taken along line I-I' of FIG. 1.

FIG. 1 is a layout of a transistor according to the present invention, and FIG. 2 is a sectional view taken along line I-I' of FIG. 1. It will be understood that when an element such as a layer, a region or a substrate is referred to as being "on" or "onto" another element, it can be directly on the other element or intervening elements may also be present.

Referring to FIGS. 1 and 2, an active region 15 is disposed in a semiconductor substrate 10, and a gate insulating layer 60 is disposed on a predetermined portion of active region 15. A gate pattern 78 is formed on gate insulating layer 60, and a gate spacer 120 cover sidewalls of gate pattern 78. Gate pattern 78 has a square shape or a rectangular shape at its cross-section. Gate pattern 78 is a silicide layer having a conductivity type, and gate spacer 120 is preferably a silicon nitride ($Si_3N_4$). Further, gate spacer 120 is preferably silicon oxide ($SiO_2$). A material for gate insulating layer 60 is selected from $SiO_x$, $SiO_xN_y$, $HfO_x$, $ZrO_x$, and a composite thereof. The silicide layer is formed by a silicidation process between Ti, Co, Ni, Ta, or a mixture thereof with a doped polysilicon layer.

An electrode region 140 and a diffusion barrier region 115 are disposed in semiconductor substrate 10. Electrode region 140 overlaps gate pattern 78 so that gate insulating layer 60 is disposed between two electrode regions 140. Each of electrode region 140 contains an impurity electrode definition region 105 and an impurity electrode region 135. Impurity electrode definition region 105 and impurity electrode region 135 have an LDD (lightly doped drain) structure. Diffusion barrier region 115 overlaps a gate spacer 120, and at the same time, surrounds electrode regions 140. A channel region 45 is disposed between two electrode regions 140. The conductivity type of gate pattern 78 is different than the conductivity type of diffusion barrier region 115 and channel region 45. Electrode region 140 has the same conductivity type as gate pattern 78.

An electrode pattern 160, which is isolated away from gate pattern 78 by gate spacer 120, is disposed on and contacts electrode region 140.

As such, gate pattern 78 is preferably disposed on semiconductor substrate 10 to form a C-MOSFET (complementary metal oxide silicon field effect transistor), an N-MOSFET, or a P-MOSFET. If gate pattern 78 has the same Fermi energy level as an N-type conductive polysilicon layer, electrode region 140 and diffusion barrier region 115 have an N-type conductivity and a P-type conductivity, respectively, to form the N-MOSFET. If gate pattern 78 has the same Fermi energy level as a P-type conductive polysilicon layer, electrode regions 140 and diffusion barrier regions 115 have a P-type conductivity and an N-type conductivity, respectively, to form the P-MOSFET. Further, the N- and the P-MOSFETs may be simultaneously disposed in semiconductor substrate 10, to form the C-MOSFET.

FIGS. 3 through 14 are sectional views taken along line I-I' of FIG. 1 illustrating a method of fabricating a transistor according to the present invention.

Figure 3:
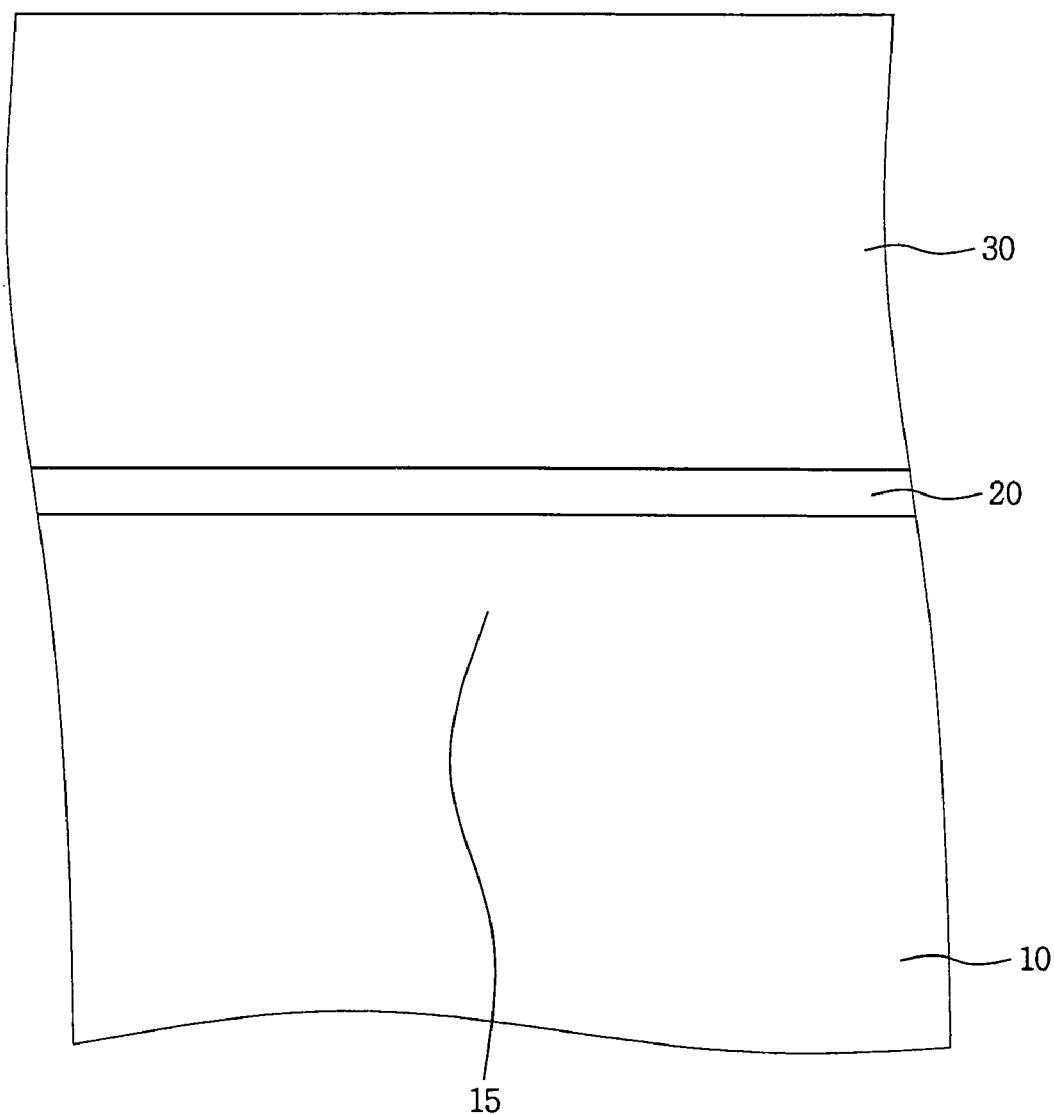
FIGS. 3 through 14 are sectional views taken along line I-I' of FIG. 1 illustrating a method of fabricating a transistor of the present invention.
Figure 4:
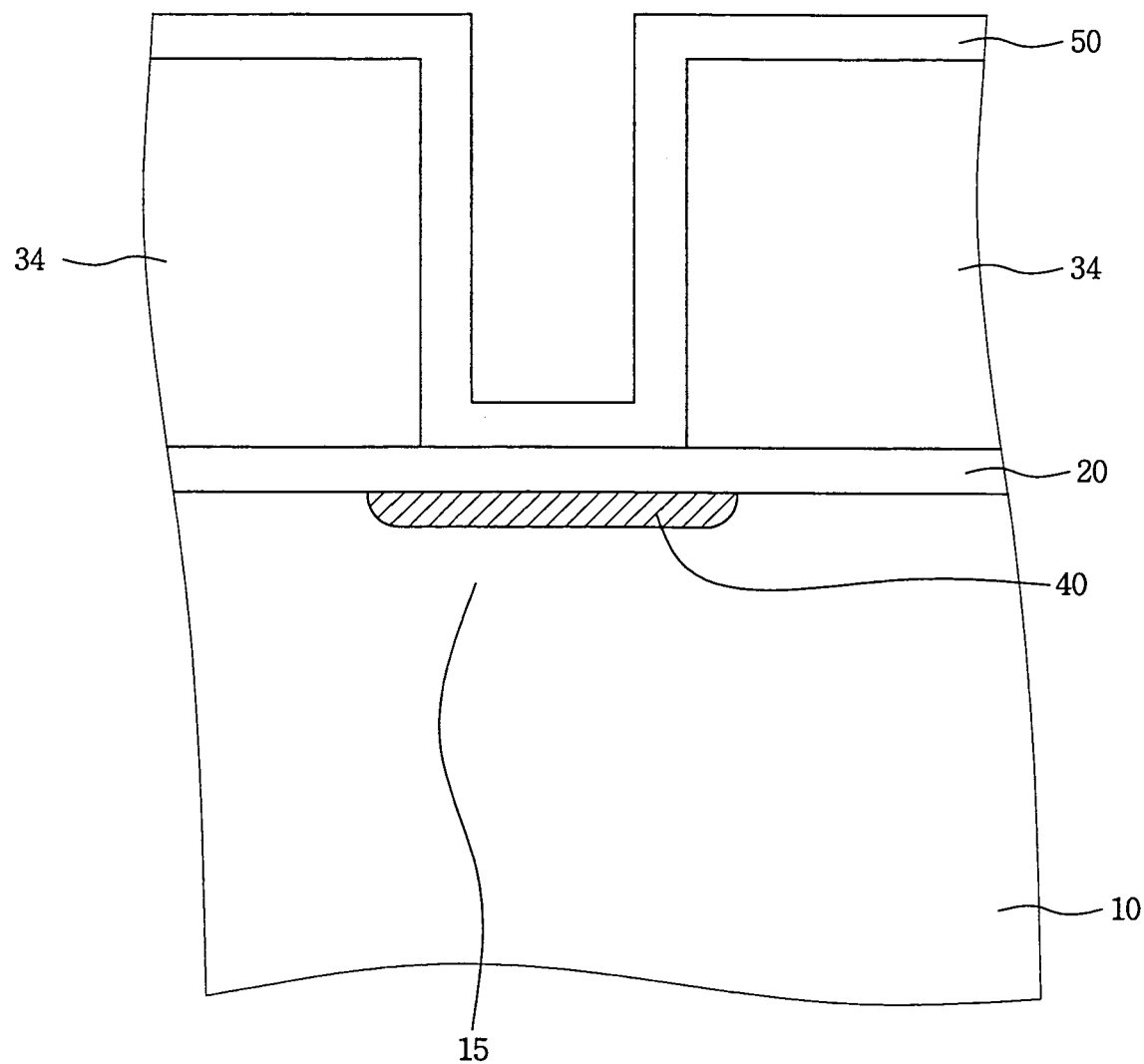

Referring to FIGS. 3 and 4, in an active region 15, a pad layer 20 is formed on a semiconductor substrate. A mask layer 30 is formed on pad layer 20. Using mask layer 30, a mask pattern 34 is formed on pad layer 20. Using mask pattern 34 as a mask, an impurity definition region 40 is formed in semiconductor substrate 10. Further, a mask spacer layer 50 is conformally formed on mask pattern 34.

Mask layer 30 is formed of an insulating material with the same etching ratio as mask spacer layer 50. Mask layer 30 and mask spacer layer 50 are formed of a material selected from $Si_xN_y/SiO_x/Si_xN_y$, $Si_xN_y/SiO_x$, $SiO_x/Si_xN_y$, $SiO_x/Si_xN_y/SiO_x$, and $Si_xN_y$. In the case of an N-MOSFET, impurity definition region 40 is formed by implanting P-type impurity ions. In the case of a P-MOSFET, impurity definition region 40 is formed by implanting N-type impurity ions. Impurity definition region 40 is implanted near the surface of semiconductor substrate 10 by controlling the implantation energy and dose of the impurity ions.

Figure 5:
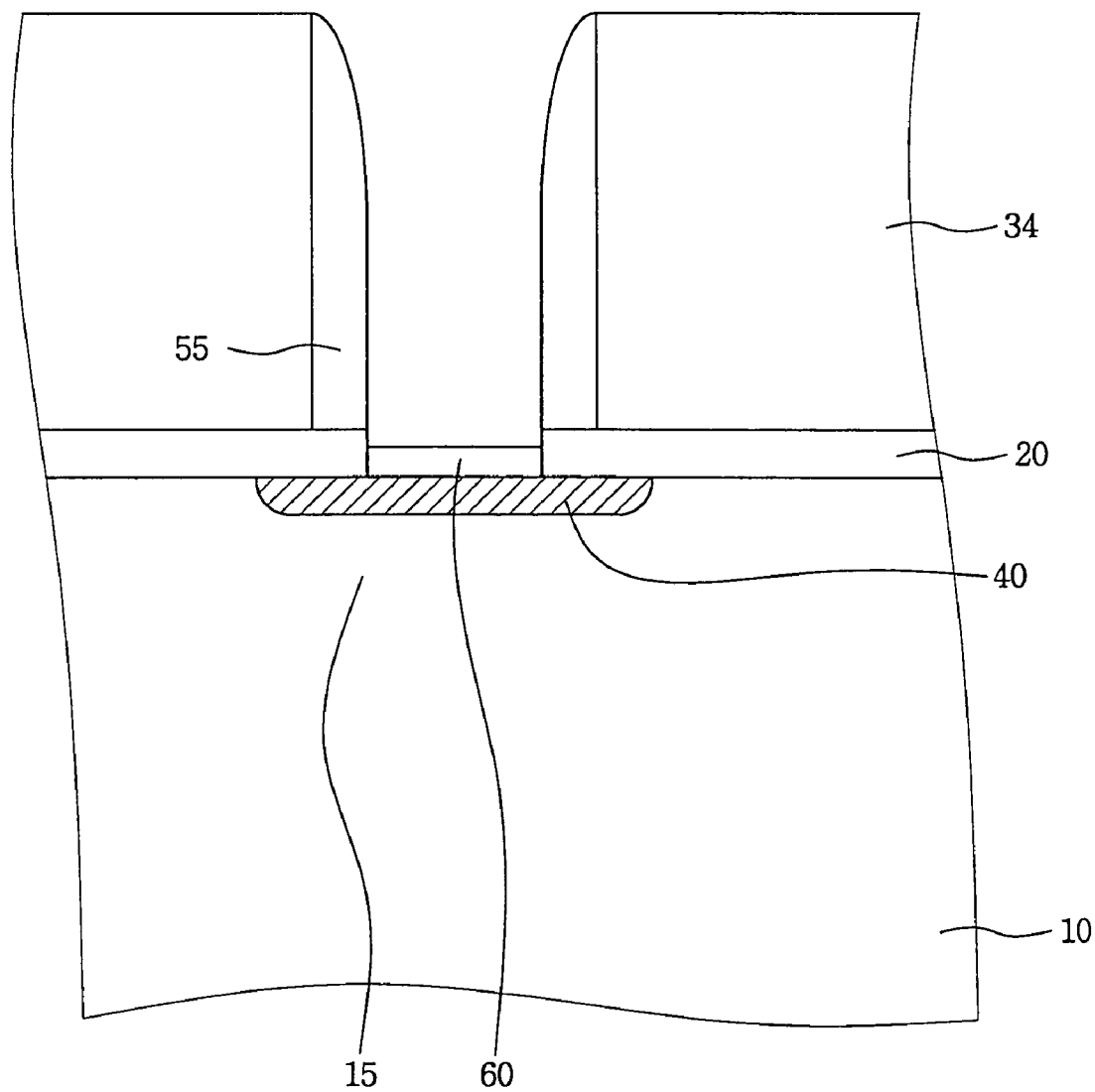
Figure 6:
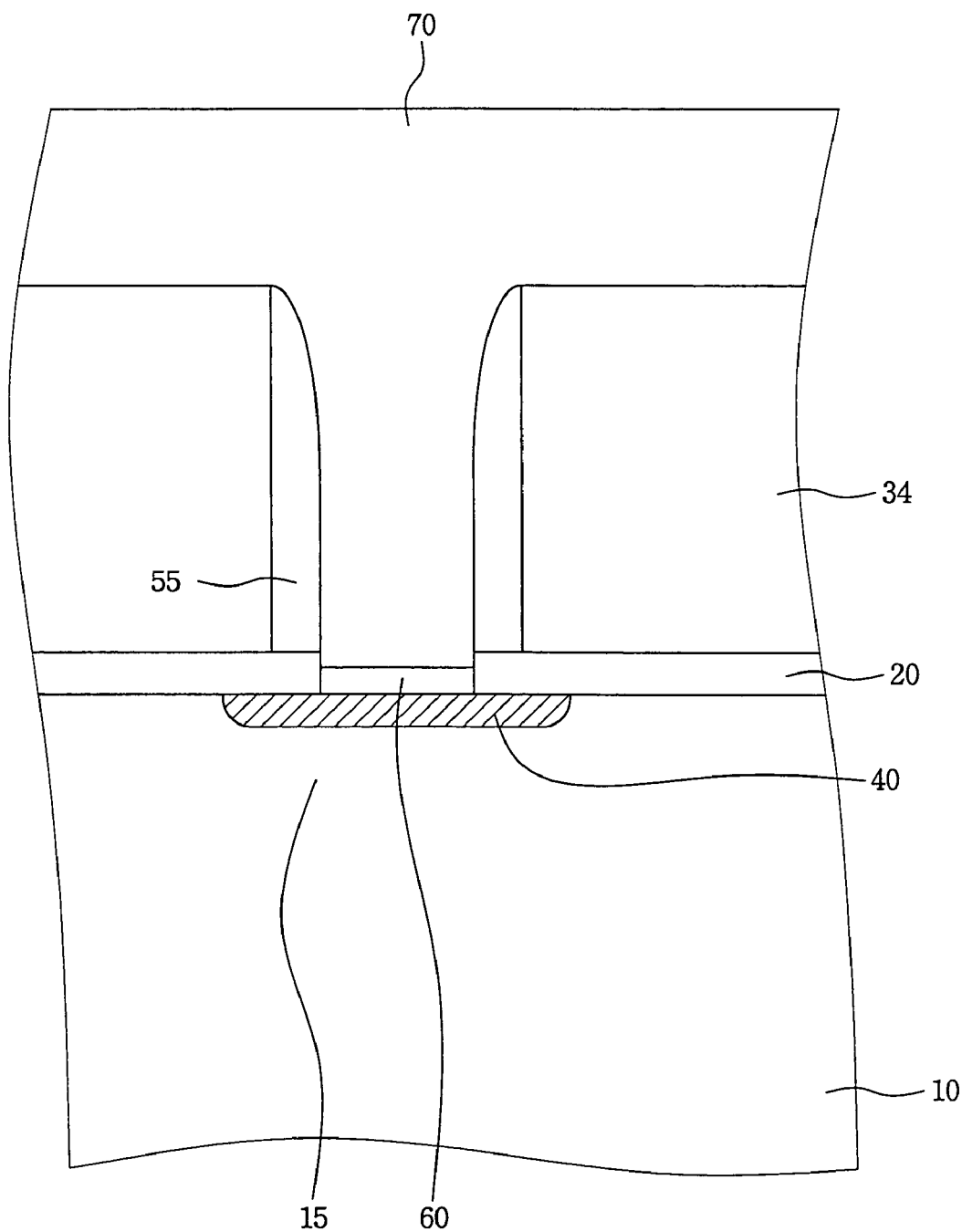

Referring to FIGS. 5 and 6, an etching process is performed on mask spacer layer 50 to expose an upper surface of mask patterns 34, which also forms a mask spacer 55. Mask spacer 55 is formed on sidewalls of mask patterns 34. The etching process is sequentially performed on pad layer 20 to expose impurity definition region 40.

A gate insulating layer 60 is formed on the exposed portion of impurity definition region 40. A sacrificial poly layer 70 is formed on the resulting structure. Gate insulating layer 60 is formed from a material selected from $SiO_x$, $SiO_xN_y$, $HfO_x$, and $ZrO_x$, and a composite thereof. Sacrificial poly layer 70 is formed of an undoped polysilicon.

Figure 7:
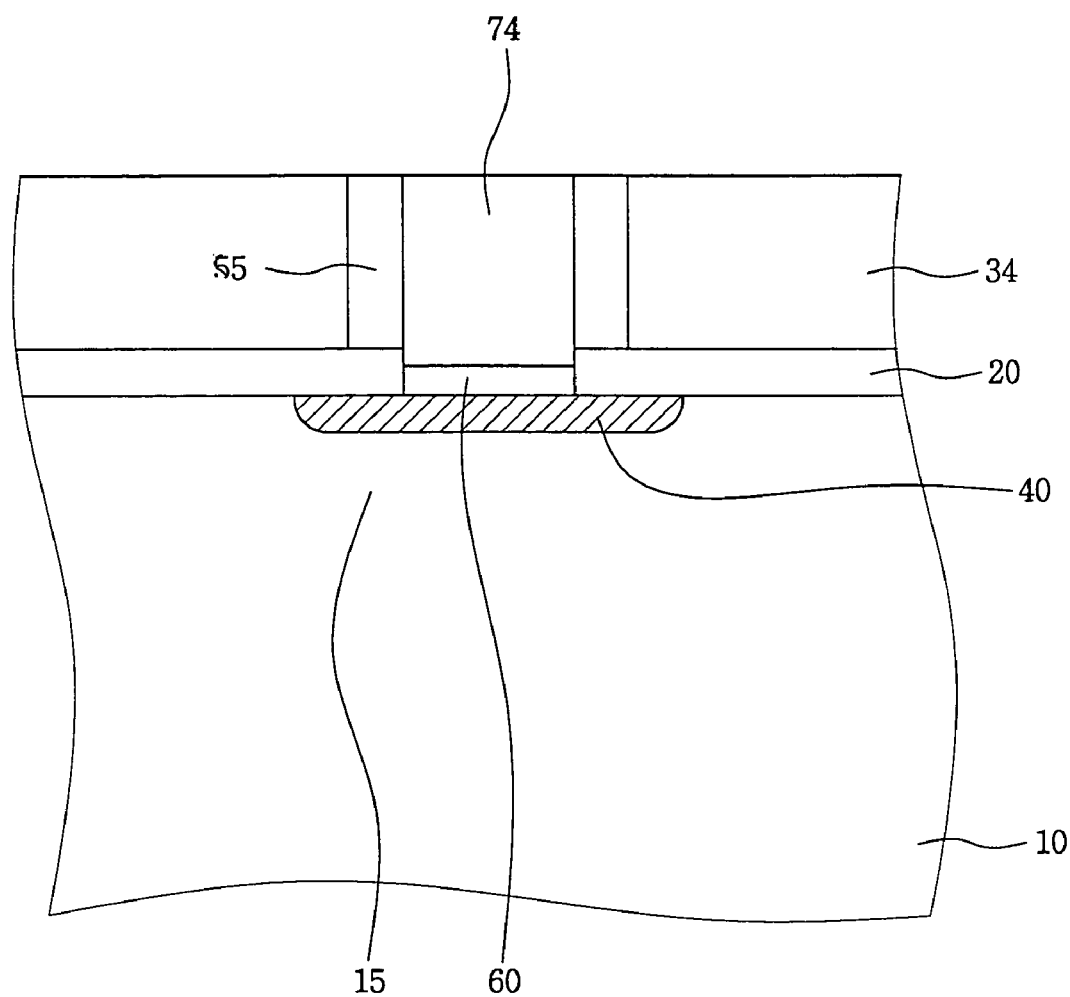
Figure 8:
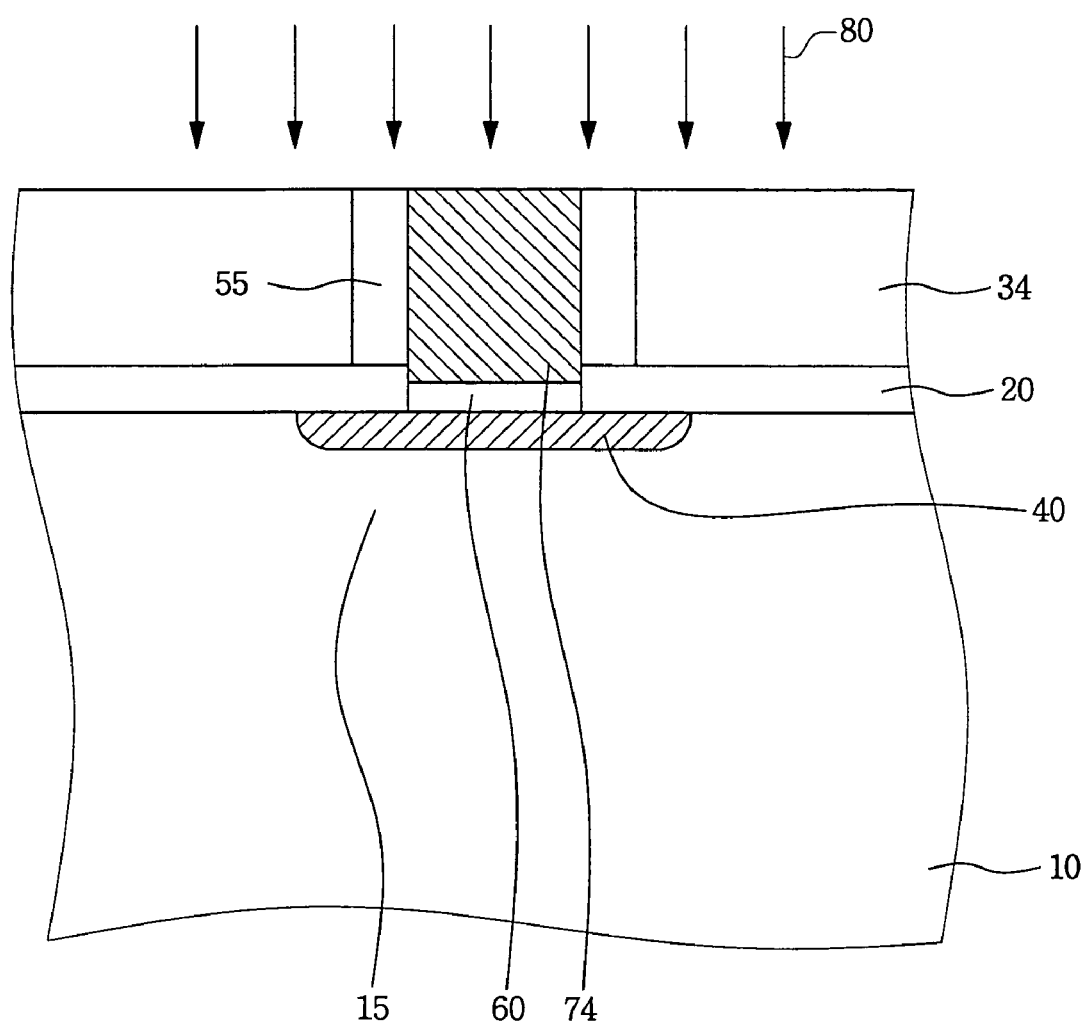

Referring to FIGS. 7 and 8, an etching process is performed on sacrificial poly layer 70 such that mask pattern 34 and mask spacer 55 are partially etched, and a sacrificial poly layer pattern 74 is formed.

Using mask pattern 34 and mask spacer 55 as a mask, a first ion implantation process 80 is performed on sacrificial poly layer pattern 74. First ion implantation process 80 is performed by controlling energy of the impurity ions such that an Rp (projection range) of the impurity ions is positioned in sacrificial poly layer pattern 74. Also, the dose of the impurity ions is about 1.0E14 to 5.0E15/$cm^2$.

In the case of an N-MOSFET, a gate pattern 78 is formed by implanting N-type impurity ions, or in the case of a P-MOSFET, gate pattern 78 is formed by implanting P-type impurity ions.

Figure 9:
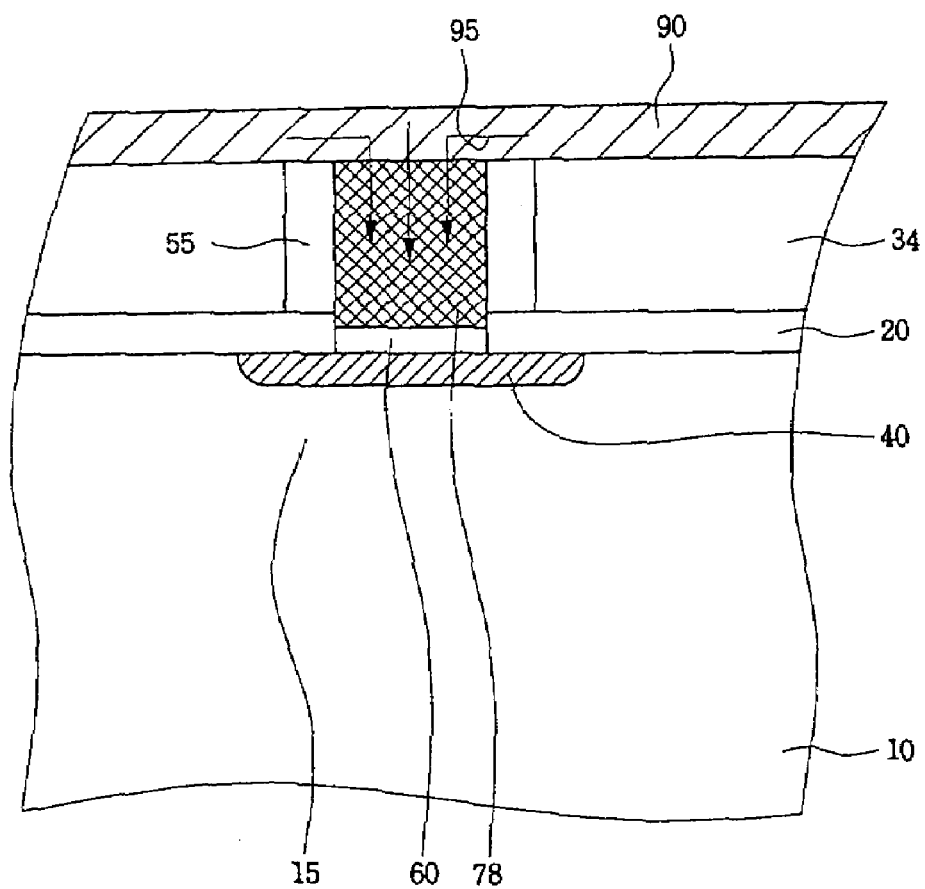
Figure 10:
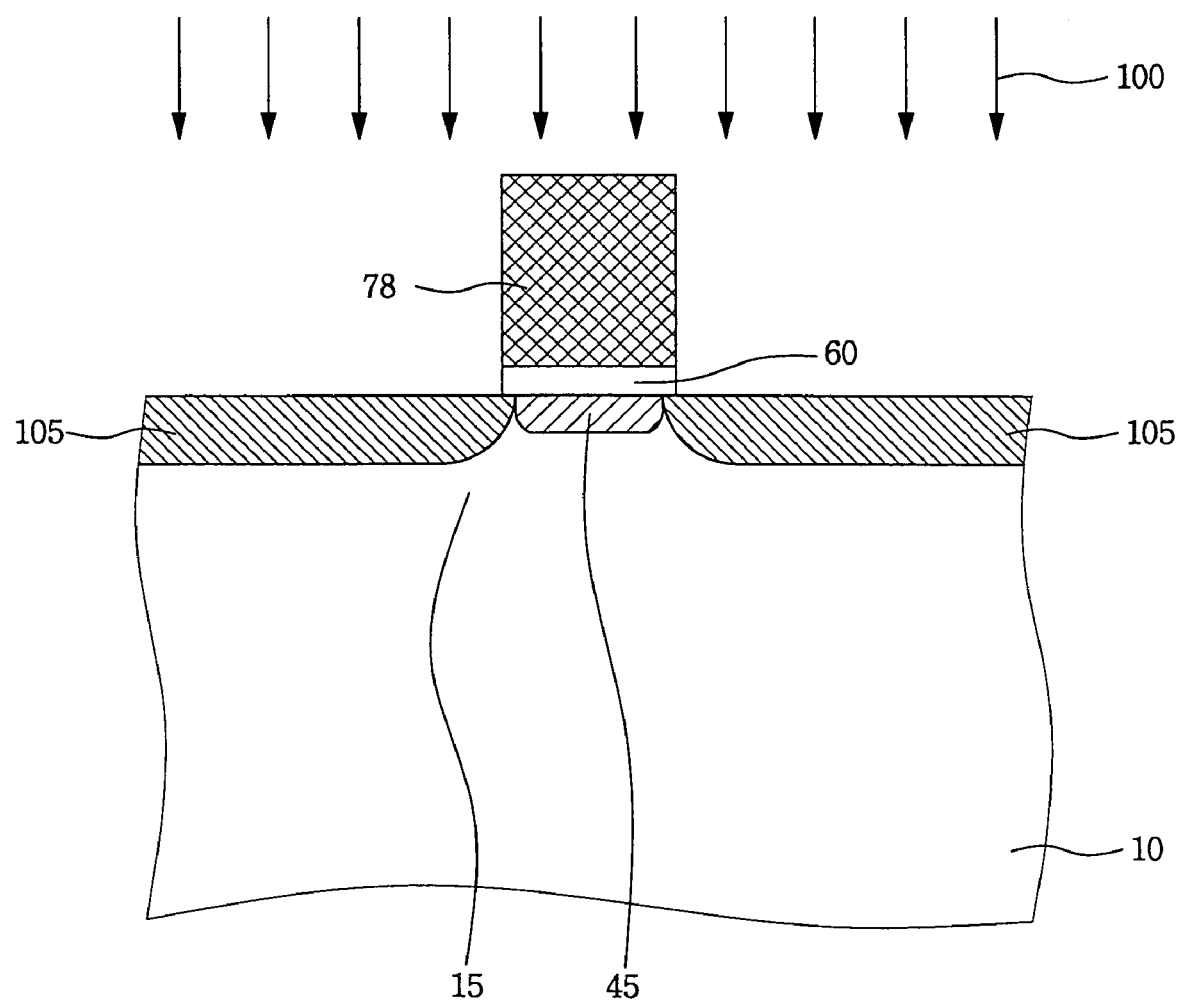

Referring to FIGS. 9 and 10, a gate metal layer 90 is formed on the resultant structure. A silicidation process 95 is performed by reacting gate metal layer 90 with sacrificial poly layer pattern 74 to transform sacrificial poly layer pattern 74 into a silicide layer. Then, the non-reacted portions of gate metal layer 90 are removed.

Gate metal layer 90 is a metal selected from Ti, Co, Ni, Ta, and a mixture thereof. An annealing process is preferably performed to form a low resistance gate pattern 78.

Subsequently pad layer 20, mask pattern 34, and mask spacer 55 are removed from semiconductor substrate 10. Then using gate pattern 78 as a mask, a second ion implantation process 100 is performed in semiconductor substrate 10 to form an impurity electrode definition region 105. Second ion implantation process 100 also implants impurity ions into gate pattern 78. The dose of impurity electrode definition region 105 is higher than that of impurity definition region 40. Impurity electrode definition region 105 overlaps gate pattern 78. In this structure, impurity electrode definition region 105 defines a channel region 45 under the gate pattern 78.

In the case of an N-MOSFET, impurity electrode definition region 105 is formed by implanting N-type impurity ions, or in the case of a P-MOSFET, impurity electrode definition regions 105 are formed by implanting P-type impurity ions.

Figure 11:
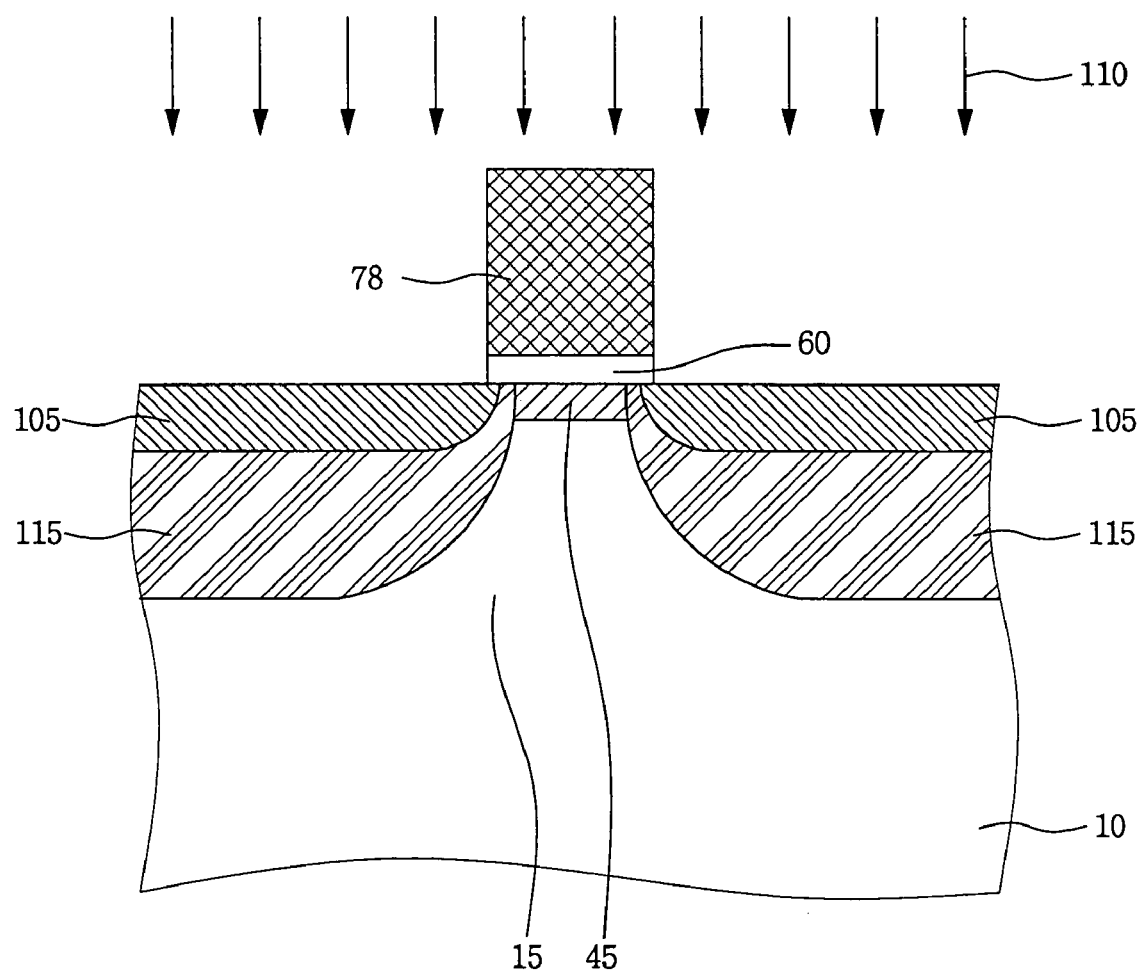
Figure 12:
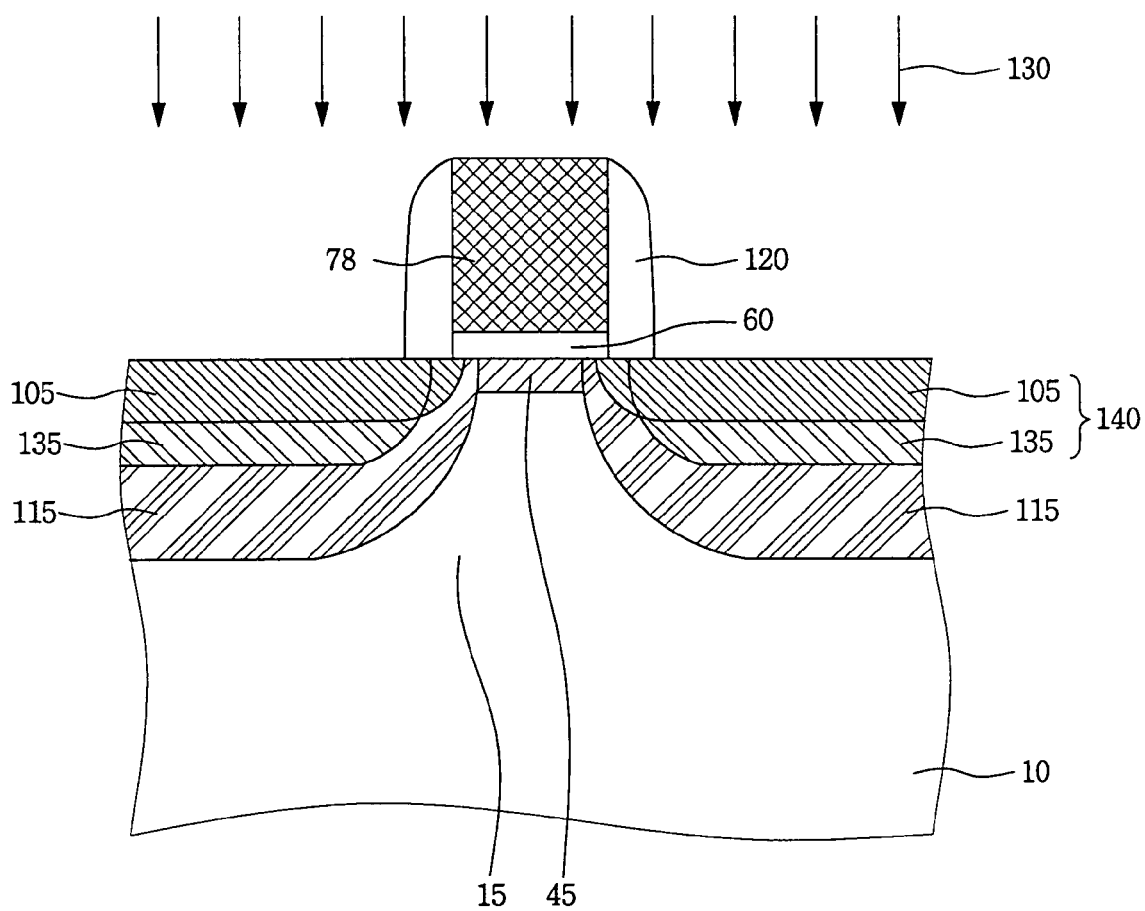

Referring to FIGS. 11 and 12, using gate pattern 78 as a mask, a third ion implantation process 110 is performed on the resultant structure. Third ion implantation process 110 is performed to form a diffusion barrier region 115 in semiconductor substrate 10. Third ion implantation process 110 is preferably performed by using impurity ions having a dose lower than those of impurity electrode definition region 105 and channel region 45. However, third ion implantation process 110 may be performed by using impurity ions having the same dose as that of channel region 45. Further, third ion implantation process 110 is performed such that an Rp (projection range) of the impurity ions is positioned in semiconductor substrate 10, and is greater than that of the impurity electrode definition regions 105. By doing so, diffusion barrier region 115 surrounds impurity electrode definition region 105.

A gate spacer 120 is formed on sidewalls of gate pattern 78. Using gate spacers 120 and gate pattern 78 as a mask, a fourth ion implantation process 130 is performed on semiconductor substrate 10. Fourth ion implantation process 130 is performed to form an impurity electrode region 135, which overlaps gate spacers 120. By controlling energy of the impurity ions, fourth ion implantation process 130 is performed such that an Rp of the impurity ions is positioned between impurity electrode definition region 105 and diffusion barrier region 115. Further, fourth ion implantation process 130 is performed such that a dose of the impurity ions is the same as first ion implantation process 90 of FIG. 9. Impurity electrode definition region 105 and impurity electrode region 135 form an electrode region 140. Electrode region 140 is formed to have an LDD (lightly doped drain) structure.

In the case of an N-MOSFET, diffusion barrier region 115 and impurity electrode region 135 are formed by implanting P-type and N-type impurity ions, respectively, or in the case of a P-MOSFET, diffusion barrier region 115 and impurity electrode region 135 are formed by implanting N-type and P-type impurity ions, respectively. Each of third and fourth ion implantation processes 110, 130 is performed such that impurity ions are also implanted in gate pattern 78.

Figure 13:
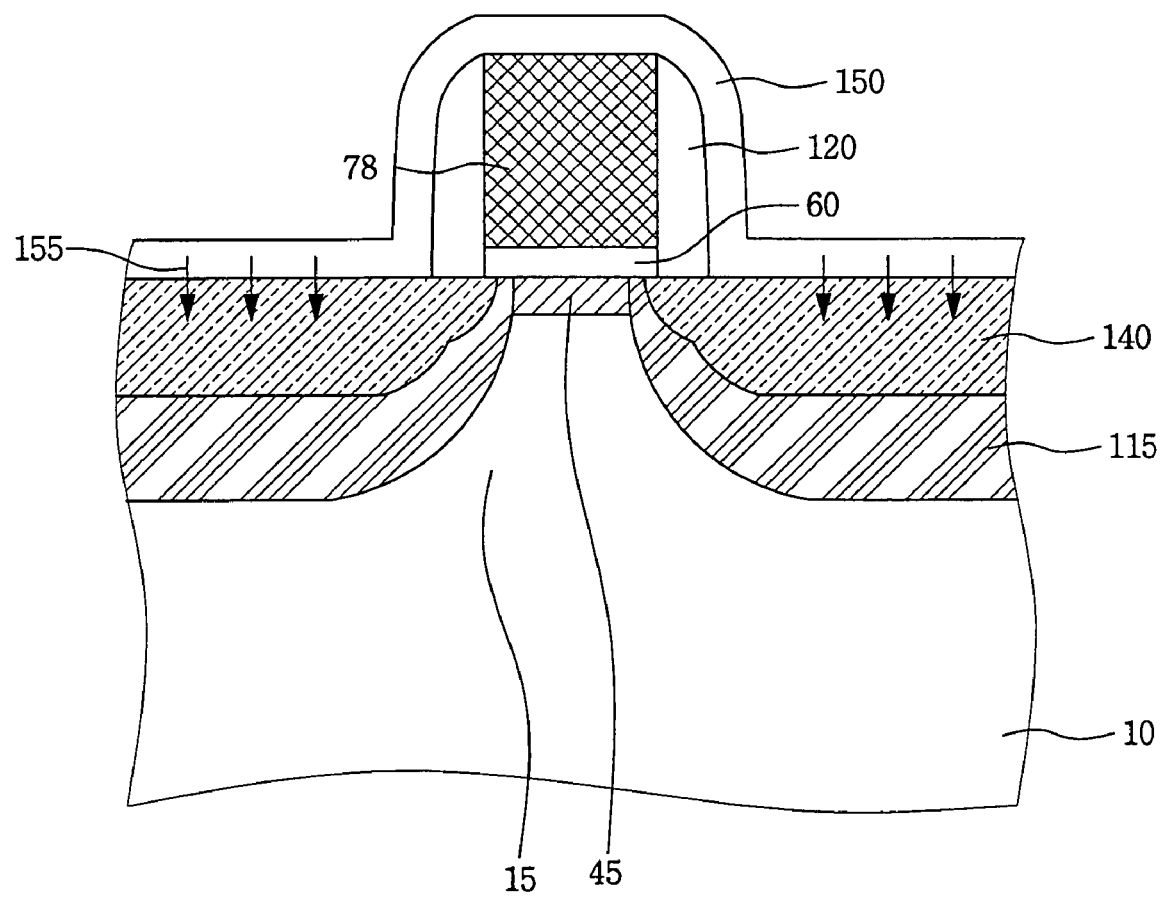
Figure 14:
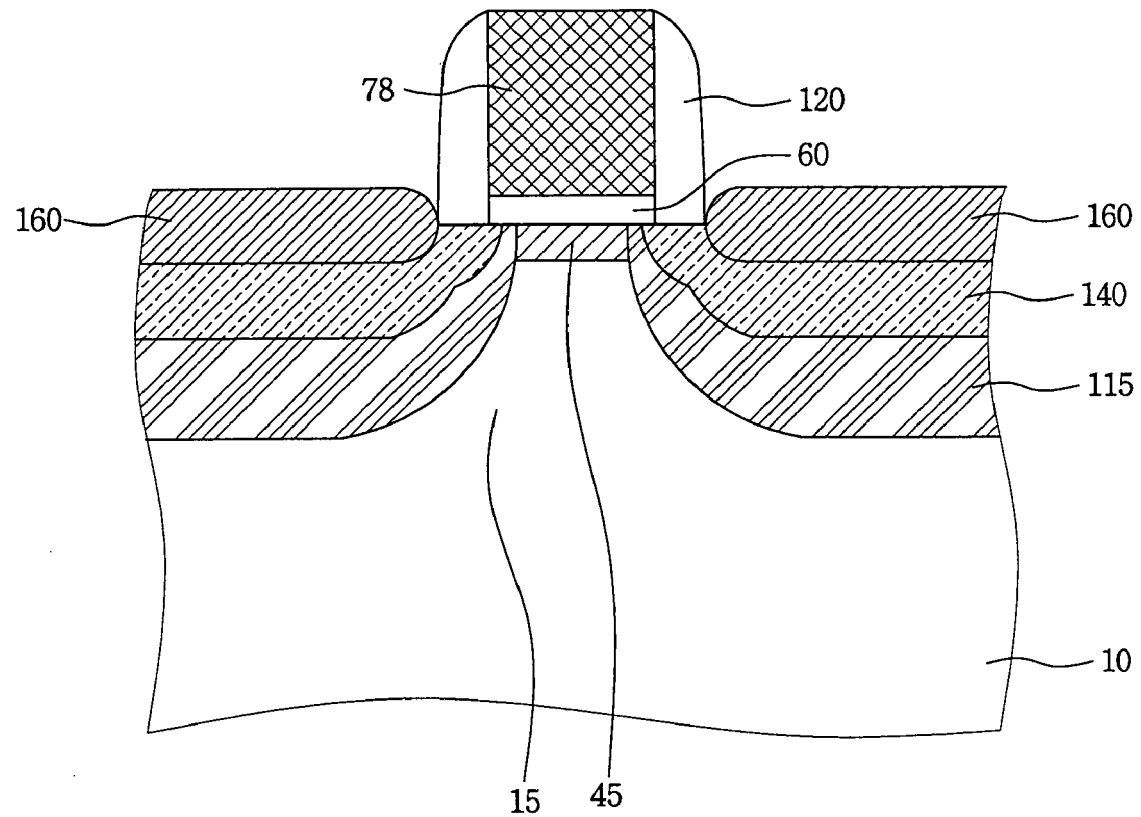

Referring to FIGS. 13 and 14, an electrode metal layer 150 is conformally formed on the resultant structure. Electrode metal layer 150 is a metal selected from Ti, Co, Ni, Ta, and a mixture thereof. A silicidation process is performed on electrode metal layer 150 to form metal silicide layers in electrode regions 140. Electrode metal layer 150 and gate pattern 78 do not react with each other during this silicidation process, because all the silicon in gate pattern 78 have been completely exhausted.

Further, any unreacted electrode metal layer 150 is removed, and an electrode pattern 160, i.e., a metal silicide layer, is formed. Electrode pattern 160 contacts electrode region 140.

Gate pattern 78 has the same Fermi energy level as a polysilicon layer of a P-type or an N-type conductivity.

A degree of freedom of the silicidation process is increased in the formation of a transistor according to the present invention, because electrode metal layer 150 does not react with gate pattern 78 during the formation of electrode patterns 160.

As described above, according to the present invention, the gate pattern is formed of a silicide layer, thereby suppressing depletion by the impurity ions in the pattern when a transistor is driven.

What is claimed is:

1. A transistor for a semiconductor device, comprising:
   a diffusion barrier region and electrode region disposed in an active region of a semiconductor substrate, wherein the electrode region is located between the diffusion barrier and a surface of the semiconductor substrate;
   a gate insulating layer disposed on the semiconductor substrate;
   a silicide gate pattern formed of a silicide material which includes a silicide metal and an impurity ions of a given conductivity type, wherein the silicide material is disposed directly on the gate insulating layer such that the silicide material is in contact with the gate insulating layer; and
   an electrode pattern disposed adjacent the gate pattern, and contacting the electrode region.

2. The transistor according to claim 1, wherein the silicide gate pattern and the electrode regions are an N-type conductivity, and the diffusion baffler region is a P-type conductivity.

3. The transistor according to claim 1, wherein the silicide gate pattern and the electrode regions are a P-type conductivity, and the diffusion barrier region is an N-type conductivity.

4. The transistor according to claim 1, further comprising a gate spacer disposed on sidewalls of the silicide gate pattern, wherein the gate spacer isolates the silicide gate pattern from the electrode pattern.

5. The transistor according to claim 1, wherein the electrode region has a lightly doped drain (LDD) structure.

6. The transistor according to claim 1, wherein the electrode pattern is a silicide layer.

7. The transistor according to claim 1, wherein the electrode region is an impurity electrode definition region and an impurity electrode region.

8. The transistor according to claim 1, further comprising a channel region under the gate pattern.

9. The transistor according to claim 1, wherein the gate insulating layer is material selected from the group consisting of $SiO_x$, $SiO_xN_y$, $HfO_x$, $ZrO_x$, and a composite thereof.

* * * * *